(12) United States Patent
Berman et al.

(10) Patent No.: US 11,874,353 B2
(45) Date of Patent: Jan. 16, 2024

(54) MULTI-SHOT ECHO PLANAR IMAGING USING REORDERED SEGMENTS AND RECURSIVE RADIO FREQUENCY PULSE DESIGN GIVING MATCHED SLICE PROFILES ACROSS SEGMENTS

(71) Applicants: THE GENERAL HOSPITAL CORPORATION, Boston, MA (US); Vanderbilt University, Nashville, TN (US)

(72) Inventors: Avery J. L. Berman, Jamaica Plain, MA (US); Jonathan R. Polimeni, Cambridge, MA (US); William A. Grissom, Nashville, TN (US); Kawin Setsompop, Charlestown, MA (US); Thomas Witzel, Boston, MA (US)

(73) Assignee: The General Hospital Corporation, Boston, MA (US)

( * ) Notice: Subject to any disclaimer, the term of this patent is extended or adjusted under 35 U.S.C. 154(b) by 178 days.

(21) Appl. No.: 17/598,035

(22) PCT Filed: Mar. 27, 2020

(86) PCT No.: PCT/US2020/025345
§ 371 (c)(1),
(2) Date: Sep. 24, 2021

(87) PCT Pub. No.: WO2020/198631
PCT Pub. Date: Oct. 1, 2020

(65) Prior Publication Data
US 2022/0179024 A1    Jun. 9, 2022

Related U.S. Application Data

(60) Provisional application No. 62/824,589, filed on Mar. 27, 2019.

(51) Int. Cl.
*G01V 3/00* (2006.01)
*G01R 33/483* (2006.01)
(Continued)

(52) U.S. Cl.
CPC ..... *G01R 33/4835* (2013.01); *G01R 33/4818* (2013.01); *G01R 33/5608* (2013.01); *G01R 33/5616* (2013.01)

(58) Field of Classification Search
CPC ............. G01R 33/3415; G01R 33/543; G01R 33/5659; G01R 33/36; A61B 5/055
(Continued)

(56) References Cited

U.S. PATENT DOCUMENTS

2010/0156411 A1  6/2010  Setsompop et al.
2010/0239151 A1  9/2010  Dannels et al.
(Continued)

FOREIGN PATENT DOCUMENTS

WO   WO-9520909 A1 *  8/1995  .......... G01R 33/446
WO   2020198631 A1    10/2020

OTHER PUBLICATIONS

International Search Report and Written Opinion issued in corresponding PCT Application No. PCT/US2020/025345, dated Jul. 31, 2020.

*Primary Examiner* — Walter L Lindsay, Jr.
*Assistant Examiner* — Frederick WEnderoth
(74) *Attorney, Agent, or Firm* — Quarles & Brady LLP

(57) ABSTRACT

Described here are systems and methods for producing images with a magnetic resonance imaging ("MRI") system using a high-resolution, motion-robust, artifact-free segmented echo planar imaging ("EPI") technique. In particular, a fast low angle excitation echo planar imaging technique ("FLEET") using variable flip angle ("VFA") radio frequency ("RF") excitation pulses that are recursively (Continued)

designed to have a flat magnitude and phase profile across a slice for a range of different flip angles by accounting for longitudinal magnetization remaining after each preceding RF pulse is applied.

21 Claims, 5 Drawing Sheets

(51) Int. Cl.
    *G01R 33/48*     (2006.01)
    *G01R 33/56*     (2006.01)
    *G01R 33/561*     (2006.01)

(58) Field of Classification Search
    USPC ......................................................... 324/309
    See application file for complete search history.

(56) References Cited

U.S. PATENT DOCUMENTS

| | | |
|---|---|---|
| 2011/0144474 A1 | 6/2011 | Ouwerkerk |
| 2012/0293172 A1 | 11/2012 | Wheaton et al. |
| 2014/0210465 A1 | 7/2014 | Kim et al. |
| 2015/0362574 A1 | 12/2015 | Wu et al. |

* cited by examiner

MULTI-SHOT ECHO PLANAR IMAGING USING REORDERED SEGMENTS AND RECURSIVE RADIO FREQUENCY PULSE DESIGN GIVING MATCHED SLICE PROFILES ACROSS SEGMENTS

CROSS-REFERENCE TO RELATED APPLICATIONS

This application is a U.S. National Stage of International Application No. PCT/US2020/025345 filed Mar. 27, 2020 which claims the benefit of U.S. Provisional Patent Application Ser. No. 62/824,589, filed on Mar. 27, 2019, and entitled "A SYSTEM FOR ROBUST MULTI-SHOT ECHO PLANAR IMAGING USING REORDERED SEGMENTS AND RECURSIVE RF PULSE DESIGN GIVING MATCHED SLICE PROFILES ACROSS SEGMENTS," which is herein incorporated by reference in its entirety.

STATEMENT REGARDING FEDERALLY SPONSORED RESEARCH

This invention was made with government support under MH111419 awarded by the National Institutes of Health. The government has certain rights in the invention.

BACKGROUND

Conventional magnetic resonance imaging ("MRI") using echo planar imaging ("EPI") acquires two-dimensional images of a subject in a single readout. By repeating this process across slices of the subject, a full three-dimensional image can be rapidly acquired, essentially freezing subject motion and physiological effects. This entire process can be repeated to generate a time series of the brain, from which brain activity or perfusion can be studied, or with different diffusion-weightings to probe tissue microstructure. To image at higher spatial resolution generally requires extending the duration of the readout period; however, EPI is susceptible to image distortion and blurring artifacts, both of which worsen with increasing readout duration.

Several techniques exist for reducing the readout duration, each with their own limitations. Most MRI exams today make use of multi-channel receiver coil arrays to employ parallel imaging methods, such as GRAPPA, to reduce the total amount of data acquired thereby accelerating the readout. Increasing the acceleration factor results in both reduced signal-to-noise ratio ("SNR") and enhanced image noise that is spatially varying (further reducing the SNR); thus, imposing limits on the tolerable amount of acceleration that can be applied. Restricting the size of the image, or the field-of-view ("FOV"), by cropping the imaging region (e.g., using spatial saturation pulses or inner-volume excitation) is one way to obtain higher resolution without increasing the readout duration, but this prevents whole-brain imaging. Segmented EPI, also known as multi-shot EPI, in which the slice data are acquired in more than one readout, is a possible solution to this problem, but as it has conventionally been implemented, a significant amount of time may elapse between the multiple readouts or segments of a given slice. This makes segmented EPI vulnerable to motion and respiration-induced magnetic field changes, resulting in temporal instability and poor image quality.

An alternative to conventional segmented EPI, known as FLEET (Fast Low-angle Excitation Echo-planar Technique), acquires all segments of a given slice sequentially in time before proceeding to acquire the next slice. This minimizes the time between segments and, by doing so, reduces the potential for motion and respiration-related errors between readouts. This method uses a constant low flip angle and several preparatory dummy pulses at the beginning of each slice's acquisition to achieve consistent signal levels between segments, which may be acceptable when high image SNR is not required. However, for many applications, such as diffusion, perfusion, and functional MRI, SNR should be maximized, and the time required for the dummy pulses every repetition is costly. In this case, a variable flip angle ("VFA") scheme can be used such that the imaging signal is maximized and, ideally, a consistent signal level is achieved across all segments without the use of dummy pulses.

In practice, VFA-FLEET produces consistent magnetization at the center plane of each slice, however, the remainder of the slice profile (roughly from the center plane to the edge of the slice) varies from shot-to-shot, owing to changing longitudinal magnetization between shots that is not properly accounted for when the same RF pulse is used for every shot and simply scaled to the desired flip angle. This results in varying signal levels across segments that produce stable image artifacts, such as ghosting.

SUMMARY OF THE DISCLOSURE

The present disclosure addresses the aforementioned drawbacks by providing a method for designing radio frequency ("RF") pulses for use in a multi-shot pulse sequence implemented with a magnetic resonance imaging ("MRI") system. The method includes recursively designing a plurality of RF pulses with a computer system by: (a) selecting a desired number of RF pulses to design for a series of RF pulses, wherein the series of RF pulses comprises a last RF pulse and one or more preceding RF pulses; (b) selecting a flip angle for the last RF pulse using the computer system; (c) recursively assigning a flip angle for each of the one or more preceding RF pulses based on the flip angle selected for the last RF pulse, using the computer system; (d) computing a target slice profile using the computer system, the target slice profile defining a desired spatial profile of transverse magnetization in an imaging slice; and (e) computing an RF pulse waveform for each of the plurality of RF pulses to achieve the target slice profile by: computing an RF pulse waveform for an initial RF pulse in the plurality of RF pulses based on the target slice profile; and for each successive RF pulse in the plurality of RF pulses, measuring a residual longitudinal magnetization remaining after each one of the plurality of RF pulses preceding a current RF pulse and incorporating the residual longitudinal magnetization into the RF pulse waveform design for the current RF pulse. The following are then stored in the computer system as RF pulse parameters: the flip angle for the last RF pulse; each flip angle for the one or more preceding RF pulses; the RF pulse waveform for the initial RF pulse in the plurality of RF pulses; and each RF pulse waveform for each successive RF pulse in the plurality of RF pulses.

Implementations may include one or more of the following features. Implementations of the described techniques may include hardware, a method or process, or computer software on a computer-readable medium.

As one aspect, the one or more preceding RF pulses can include at least two RF pulses.

As another aspect, each flip angle for the one or more preceding RF pulses can be recursively assigned according to $\alpha_{i-1} = \tan^{-1}(\sin(\alpha_i))$, where $\alpha_i$ is the flip angle for an ith RF pulse in the plurality of RF pulses and $\alpha_{i-1}$ is the flip angle for an (i−1)th RF pulse in the plurality of RF pulses.

In still another aspect, the flip angle for the last RF pulse can be selected to maximize measured signal. The flip angle for the last RF pulse can as one example be selected as 90 degrees. As another example, the flip angle for the last RF pulse can be selected as greater than 90 degrees.

In yet another aspect, the flip angle for the last RF pulse and each flip angle for the one or more preceding RF pulses can be different.

As another aspect, each flip angle for the one or more preceding RF pulses can be selected to achieve constant transverse magnetization after each RF pulse in the plurality of RF pulses.

As yet another aspect, computing the RF pulse waveform for each successive RF pulse in the plurality of RF pulses can also include incorporating a longitudinal relaxation when measuring the residual longitudinal magnetization remaining after each one of the plurality of RF pulses preceding the current RF pulse. In these instances, each flip angle for the one or more preceding RF pulses may be assigned by reducing each flip angle until a desired solution is achieved.

As still another aspect, each RF pulse waveform can be computed using a Shinnar-Le Roux (SLR) pulse design algorithm. A phase of an alpha polynomial in the SLR pulse design algorithm can be incorporated into a beta polynomial in the SLR pulse design algorithm so as to flatten a phase of the target slice profile and achieve a constant isodelay time of the plurality of RF pulses.

It is another aspect that a time-bandwidth product of the initial RF pulse can be increased for each subsequent one of the plurality of RF pulses by a constant factor so as to account for increasing spatial frequencies generated in the target slice profile. The constant factor may also account for achieving an equal time-bandwidth for each of the plurality of RF pulses.

As another aspect, the multi-shot pulse sequence can be a variable flip angle (VFA) fast low-angle excitation echo-planar technique (FLEET) pulse sequence.

As still another aspect, the RF pulse parameters can be sent to an MRI system and a pulse sequence can be performed with the MRI system using the RF pulse parameters to generate a plurality of RF excitation pulses in order to generate and acquire magnetic resonance data. In some instances, an image can be reconstructed from the magnetic resonance data.

It is another aspect of the present disclosure to provide a method for producing an image of a subject using an MRI system. The method includes acquiring k-space data from a slice in a subject using the MRI system to perform a pulse sequence that includes a multi-shot variable flip angle (VFA) radio frequency (RF) excitation that excites spins in the slice and comprises a plurality of different RF excitation pulses each having a flip angle that maximizes measured signals and achieves consistent signal across excitations, and a multi-shot echo planar imaging (EPI) data acquisition that acquires k-space data after each RF excitation pulse by sampling magnetic resonance signals generated by the excited spins in a plurality of different segments of k-space. Each of the plurality of different RF excitation pulses is recursively designed such that slice profiles of the plurality of different RF excitation pulses are matched for each of the different segments of k-space by designing each RF excitation pulse to account for longitudinal magnetization remaining after each preceding RF excitation pulse. An image of the subject is then reconstructed from the acquired k-space data.

Implementations may include one or more of the following features. Implementations of the described techniques may include hardware, a method or process, or computer software on a computer-readable medium.

As one aspect, designing each RF excitation pulse can also incorporate longitudinal relaxation between RF pulses when accounting for longitudinal magnetization remaining after each preceding RF excitation pulse.

As another aspect, the plurality of different segments of k-space can include a plurality of different interleaved segments of k-space.

As still another aspect, the EPI data acquisition can be a fast low-angle excitation echo-planar technique (FLEET), in which the segments of k-space for the slice are acquired consecutively in time. In some aspects, when signal intensities across each of the different segments of k-space are not equal, additional corrections can be computed and applied to each segment to balance them. The additional corrections may be computed by acquiring one-dimensional navigator signals before each readout using only frequency-encoding gradients and normalizing remaining magnitude differences across the segments of k-space by a scalar factor. The scalar factor can be computed by minimizing a least-squares difference across navigator signals. The additional corrections may also be computed by reconstructing an image for each of the plurality of different RF excitation pulse and applying a two-dimensional normalization across segments of k-space based on a ratio of the image of each RF pulse relative to an image from a reference RF pulse. The image from the reference RF pulse can be reconstructed from data acquired from a calibration scan.

In still another aspect, the plurality of different RF excitation pulses can be designed to achieve signal intensities across the segments of k-space such that signal levels across the interleaved segments of k-space are balanced.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here are systems and methods for designing and using radio frequency ("RF") pulses in magnetic resonance imaging ("MRI"). The systems and methods described in the present disclosure can advantageously be used for designing RF pulses used in a variable flip angle ("VFA") pulse sequence, such as a VFA pulse sequence with an echo planar imaging ("EPI") acquisition. The pulse sequence may be a multi-shot EPI sequence, which in some instances may be a VFA fast low-angle excitation echo-planar technique ("FLEET"), or VFA-FLEET, pulse sequence.

In general, the systems and methods described in the present disclosure make use of a recursive RF pulse design scheme using Shinnar-Le Roux, or other suitable, RF pulses. In this scheme, the profile of the longitudinal magnetization remaining after each RF pulse is incorporated into the target pattern of the next RF pulse. In this way, the RF pulse design accounts for shot-to-shot variations associated with changes in the longitudinal magnetization between shots that are otherwise not accounted for when the same RF pulse is used for every shot and instead merely scaled to the desired flip angle. As a result, the RF pulse design described in the present disclosure reduced varying signal levels across segments that would otherwise produce stable image artifacts, such as ghosting.

Additionally, in some implementations, to account for remaining signal differences between shots the signal intensities across segments can be scaled to balance signal levels across interleaves. As one example, the signal intensities can be scaled using a least-squares fitting across the one-dimensional navigator signal typically acquired prior to the readout of each segment. As another example, remaining signal differences can be modeled and corrected in two-dimensions by acquiring a set of calibration scans where all segments are acquired for each of the plurality of RF pulses, therefore, resulting in a reconstructed image for each of the plurality of RF pulses.

Using the RF pulse design described in the present disclosure, a VFA-FLEET imaging technique can be used for high-resolution EPI, while providing high SNR and being fully compatible with other techniques such as parallel imaging.

Figure 1:
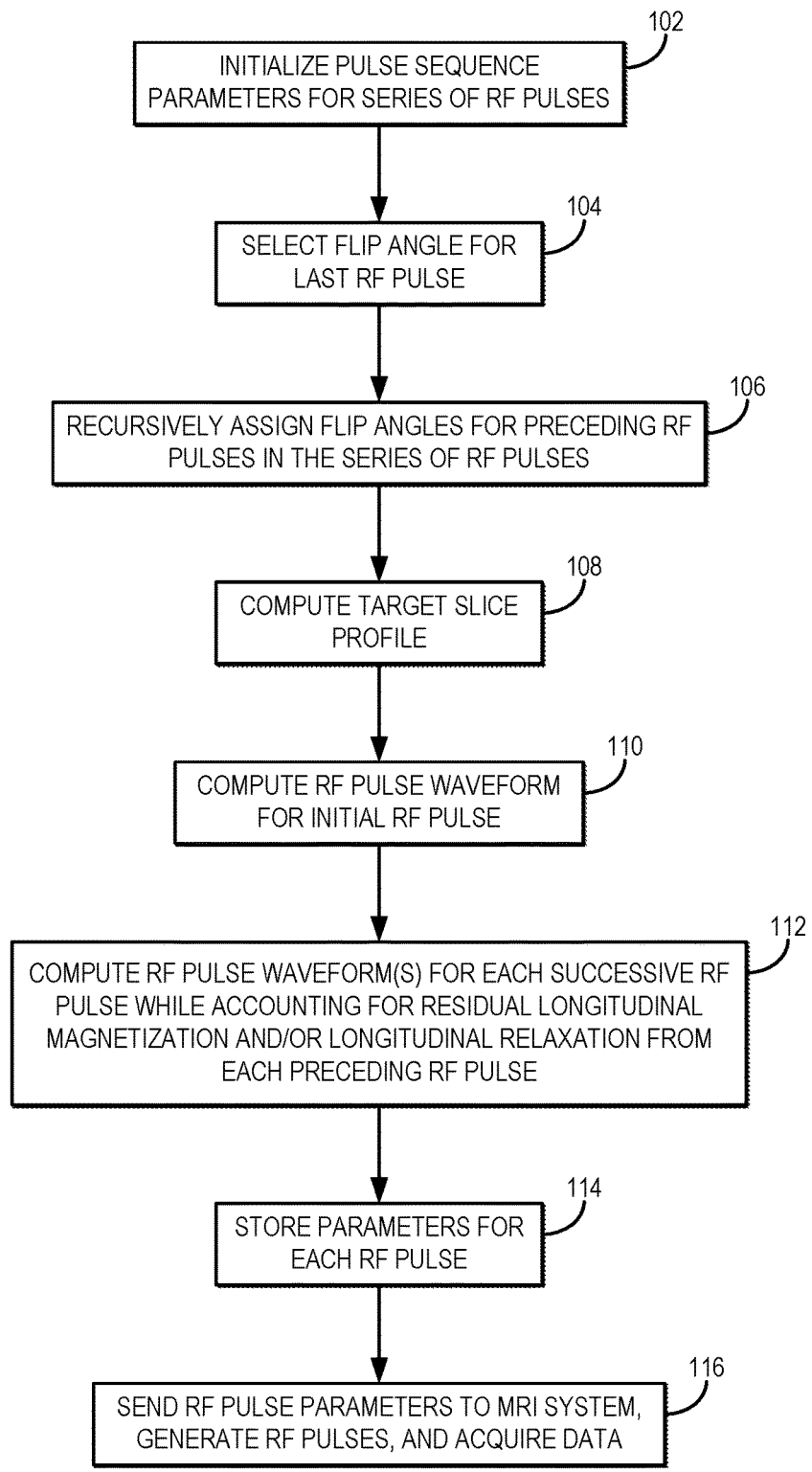
FIG. 1 is a flowchart setting forth the steps of an example method for designing RF pulses using a recursive pulse design process, and acquiring data from a subject using an MRI system that is operated to generate the designed RF pulses.

Referring now to FIG. 1, a flowchart is illustrated as setting forth the steps of an example method for designing RF pulses for use in a multi-shot MRI pulse sequence, such as a multi-shot EPI pulse sequence, which may in some instance include a VFA-FLEET pulse sequence. As noted above, RF pulses are designed using a recursive process that ensures excitation of the same slice profile across segments in a multi-shot pulse sequence, such as a multi-shot segmented EPI sequence. As a result, image artifacts that would otherwise arise when the longitudinal magnetization is not accounted for when scaling the conventional RF pulse to the desired flip angles are substantially mitigated.

The method includes initializing one or more pulse sequence parameters for a series of RF pulses using a computer system, as indicated at step 102. For instance, the number of shots, and thus the number of RF excitation pulses to design, can be selected or otherwise initialized. As one non-limiting example, the number of shots can be selected by a user using a computer system. The computer system can generate or otherwise provide a user interface, such as a graphical user interface ("GUI"), via which the user can initialize the one or more pulse sequence parameters.

The flip angle for the last RF pulse is then computed or otherwise selected, as indicated at step 104. As one example, the flip angle can be selected based on a desired effect on the longitudinal magnetization. For instance, a 90 degree flip angle can be selected to achieve rotation of the longitudinal magnetization in the region defined by the slice profile into transverse magnetization. In other instances, a flip angle other than 90 degrees can be selected. For example, in a VFA-FLEET implementation, the initial flip angle can be given by a recursion relation after selecting the last flip angle in the train of pulses. This last flip angle may be selected to maximize the signal, which for many instances may be less than 90 degrees.

The flip angle for each preceding RF pulse in the series of RF pulses is then recursively assigned, as indicated at step 106. In general, the flip angle can be recursively computed based on the flip angle value computed or otherwise selected for the previous RF pulse. As an example, by accounting for the pseudo-steady-state of VFA-FLEET, target flip angles can be determined recursively as:

$$\alpha_{i-1} = \tan^{-1}(\sin(\alpha_i)) \quad (1);$$

where $\alpha_i$ is the flip angle of the current RF pulse and $\alpha_{i-1}$ is the flip angle of the previous RF pulse. In this example, the initial flip angle assigned corresponds to the last RF pulse in the pulse sequence and the subsequently assigned flip angles occur at successively earlier time points in the pulse sequence.

In a non-limiting example, to maximize magnetization, the final excitation can be set to 90 degrees. For an example two-shot sequence, the recursively determined flip angles can be $\alpha_i = \{45°, 90°\}$. For an example three-shot sequence, the recursively determined flip angles can be $\alpha_i = \{35°, 45°, 90°\}$. Alternatively, the same flip angle can be assigned for the current RF pulse as was assigned for one or more of the previous RF pulses.

The slice profile for the initial RF pulse in the series of RF pulses is then computed or otherwise selected, as indicated at step 108. For example, the slice profile can be computed or otherwise selected based on a desired magnetization to achieve in a slice. In this way, the slice profile for the initial slice can be referred to as a target slice profile. The RF pulse waveform for the initial RF pulse is then computed based on the target slice profile, as indicated at step 110. RF pulse waveforms for each successive RF pulse in the series of RF pulses are then computed while accounting for residual longitudinal magnetization and/or longitudinal relaxation from the preceding RF pulses, as indicated at step 112 and described in more detail below.

As one non-limiting example, when using a single Hann-windowed sinc RF pulse to achieve each of the plurality of flip angles, this may result in non-uniform slice profiles from shot-to-shot. In these instances, it may be advantageous to use a recursive RF pulse design to reduce this non-uniformity using, for example, an SLR RF pulse design. In some instanced, when using an SLR RF pulse design the phase of the alpha polynomial may be incorporated into the beta polynomial of the SLR algorithm in order to get a flatter phase profile across the slice.

In general, the RF pulse waveform computed or otherwise selected for the initial RF pulse is updated for the current RF pulse such that the current RF pulse will affect substantially the same slice as does the preceding RF pulse. The updates made will generally compensate for shot-to-shot variations. For instance, the RF pulse waveform can be computed by taking into account the longitudinal magnetization remaining after each preceding RF pulse and incorporated that residual magnetization into the target pattern of the slice profile for the current RF pulse. In this way, each subsequently designed RF pulse will account for shot-to-shot variations associated with changes in the longitudinal magnetization between shots. When computing the longitudinal magnetization, the longitudinal relaxation between pulses (i.e., the T1 recovery) may also be incorporated. In those instances where the longitudinal relaxation is accounted for when updating the slice profile for the next RF pulse, the recursive flip angle relationship described below in Eqn. (1) may not be valid. In these instances, the flip angle can instead be manually adjusted (e.g., scaled down) until a feasible solution is reached.

When all of the desired RF pulses have been designed, the corresponding RF pulse parameters are stored for later use, as indicated at step 114. The RF pulse parameters can include the RF pulse waveforms, which may include magnitude and phase information, the flip angles, the order in which the RF pulses will be performed in the pulse sequence, and other such parameters.

The stored parameters can then be transmitted or otherwise communicated to an MRI system where they are used by the MRI system to control the generation of RF pulses during an imaging scan in order to acquire data from a subject, as indicated at step 116. For example, the RF pulse parameters can be used to generate RF pulses within a prescribed pulse sequence in order to produce magnetic resonance signals within the subject being imaged. The MRI system then records these generated signals as magnetic resonance data (e.g., k-space data), from which one or more images of the subject can be reconstructed.

In some implementations, the RF pulses designed using the techniques described in the present disclosure can be multiband RF pulses, such as those that may be used in a simultaneous multislice ("SMS") acquisition. In these instances, the slice profile for each multiband RF pulse can define the multiple different slices to be excited by the multiband RF pulse. The individual component RF pulses that make up the multiband RF pulse can also be separately designed, such that the slice profile for these component RF pulses will correspond to the single slice being excited by the component of the multiband RF pulse.

Figure 2:
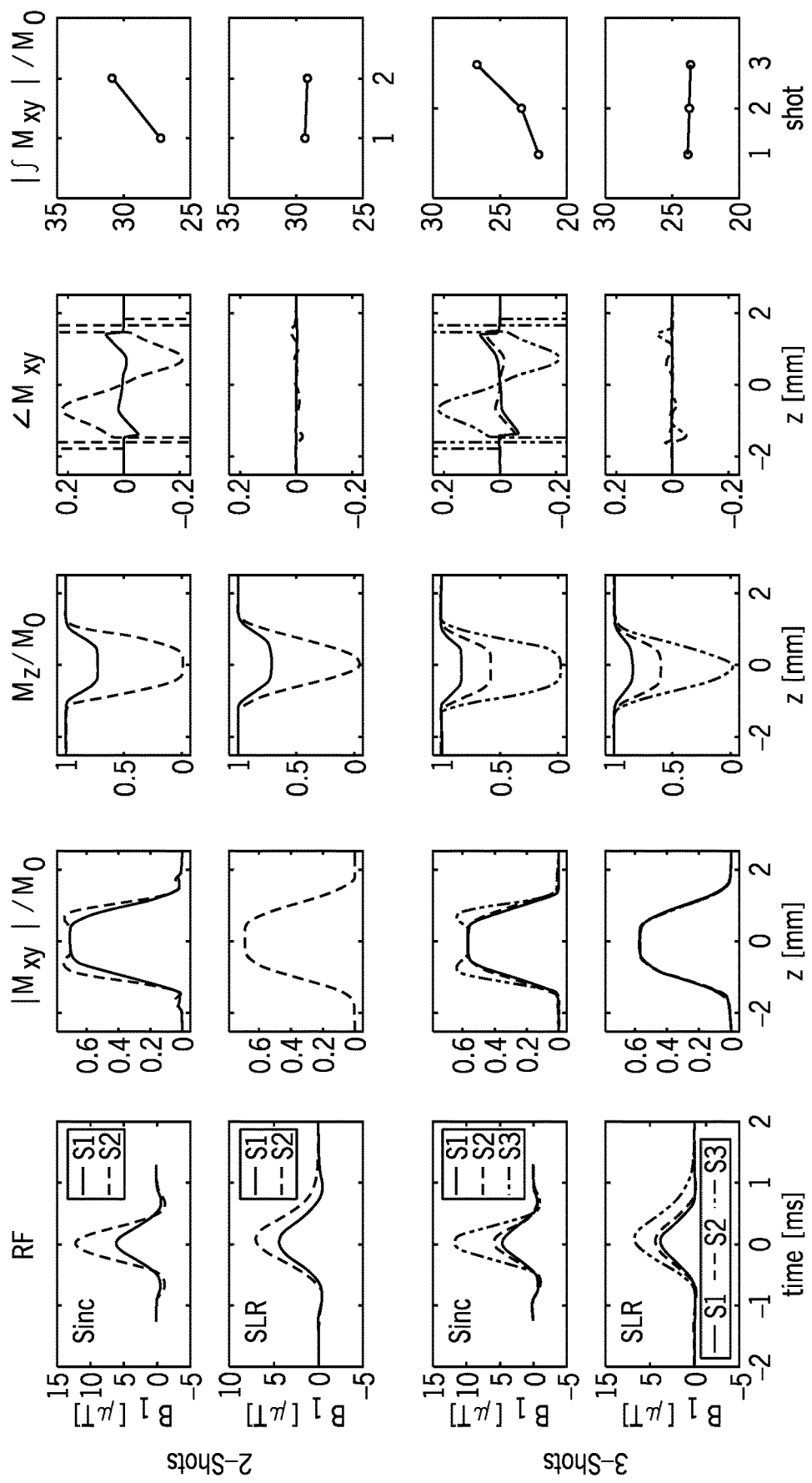
FIG. 2 shows an example of transverse and longitudinal slice profiles resulting from sinc RF pulses that were scaled to variable flip angle excitation angles in comparison to profiles resulting from SLR RF pulses that have been designed using the methods described in the present disclosure.

FIG. 2 shows an example of sinc RF pulses versus SLR RF pulses and the corresponding slice profiles for example 2-shot and 3-shot implementations. S1 corresponds to the RF/profile for shot 1, S2 to shot 2, and so on. Due to the longitudinal magnetization, $M_z$, being attenuated between shots, the sinc pulses generate non-uniform slice profiles in magnitude (column 2), phase (column 4), and integrated transverse magnetization, $M_{xy}$ (column 5). The SLR pulses properly account for this. The S2 and S3 SLR pulses contain more RF energy near their end, reflecting the fact that they must produce more high-frequency excitation to achieve the same out-of-slice to in-slice transitions as $M_z$ is attenuated between shots.

Figure 3:
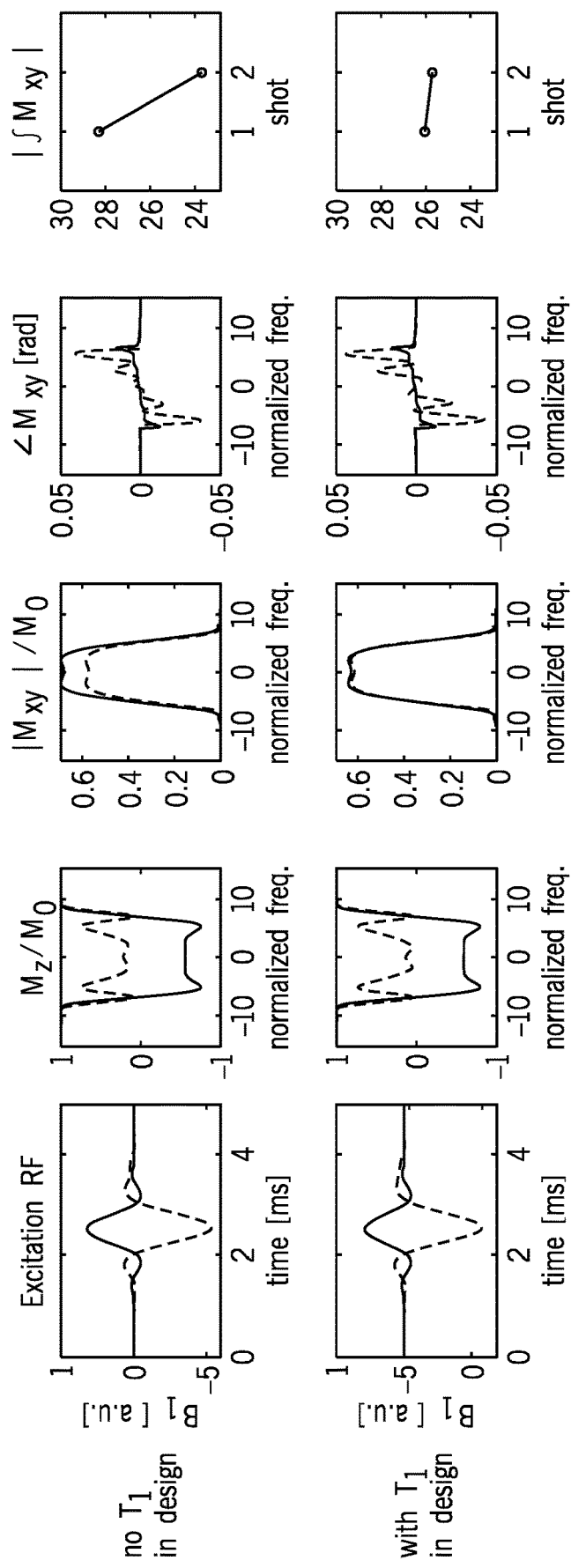
FIG. 3 shows an example where the longitudinal relaxation rate of tissue has been accounted for in the SLR RF pulse design using the methods described in the present disclosure. In this embodiment the excitation pulses are for a spin-echo pulse sequence.

FIG. 3 shows an example of slice profiles when longitudinal relaxation (e.g., via longitudinal relaxation time, T1) was included in the slice profile Bloch simulations, but not in the pulse design (top row) and then when included in both pulse design and simulation (bottom row). Simulated T1/TR=15, e.g., TR=100 ms and T1=1500 ms. Accounting for relaxation necessitated reducing the initial flip angle in the pulse design—in this case reducing from 45° to 40°—but at no expense to the mean slice profile integral across shots as seen in the plots on the far right. The slice profile integrals vary by −16% (top row) and −1.5% (bottom row).

Figure 4:
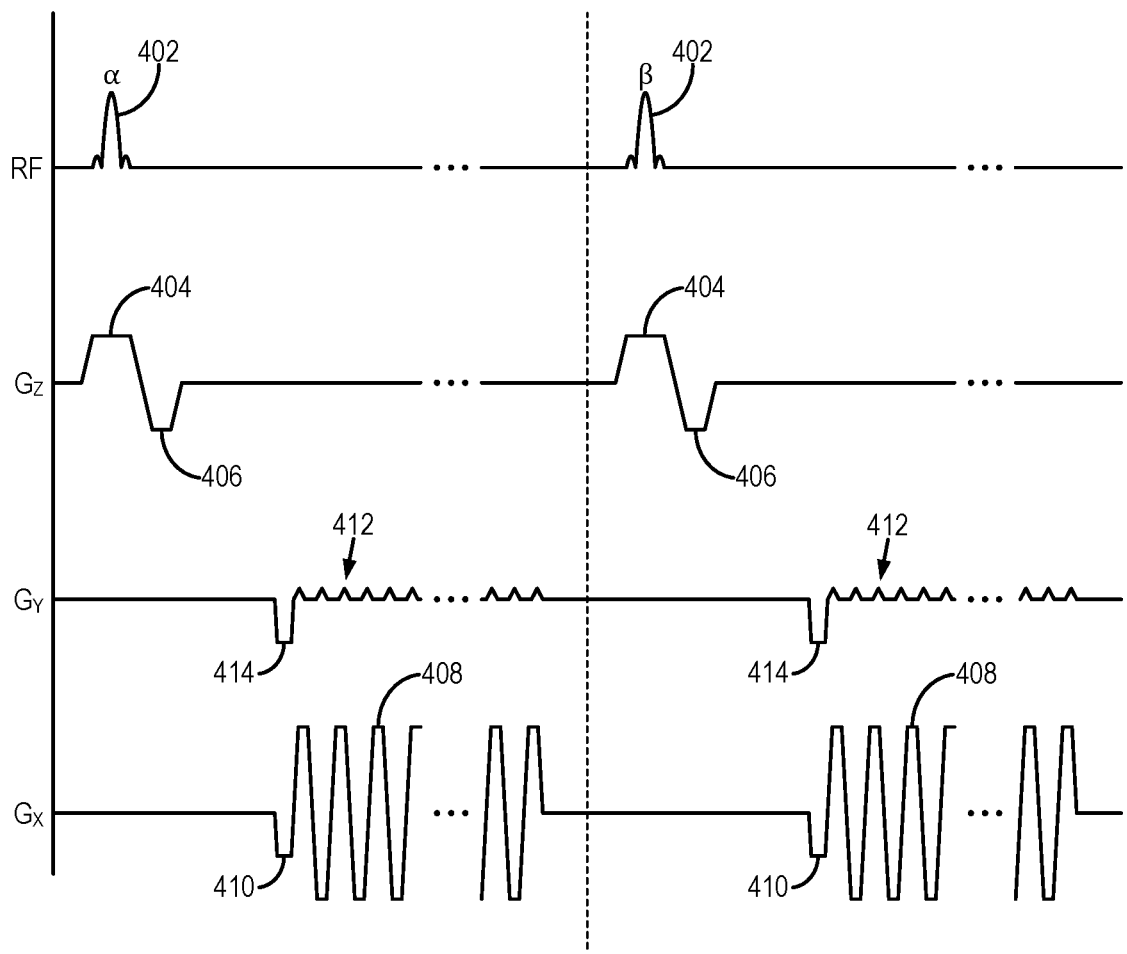
FIG. 4 is an example of a VFA-FLEET-based multi-shot EPI pulse sequence.

Referring now to FIG. 4, an example pulse sequence diagram for a VFA-FLEET imaging technique using RF excitation pulses designed according to the methods described in the present disclosure is illustrated. In this example, two EPI segments, and thus two shots, are implemented; however, the methods described in the present disclosure can also be implemented with pulse sequences with a greater number of shots. The pulse sequence generally includes multiple "shots" or RF excitations that include a plurality of RF excitation pulses and associated slice-select gradient pulses, each followed by an EPI acquisition. Each shot of the pulse sequence includes an RF excitation pulse 402 that is played out in the presence of a slice-select gradient 404 in order to produce transverse magnetization in a prescribed imaging slice. As described above, the RF excitation pulse 402 is a recursively designed RF pulse. Together, these improvements eliminate the strong image artifacts seen in previous VFA-FLEET approaches. This improved approach can be used for high-resolution EPI while also providing high SNR, and is fully compatible with other techniques such as parallel imaging which, when combined, can provide extremely valuable high-resolution imaging.

The slice-select gradient 404 includes a rephasing lobe 406 that acts to rephase unwanted phase dispersions introduced by the slice-select gradient 404, such that signal losses resultant from these phase dispersions are mitigated. Although FIG. 4 shows the same slice-select gradient 404 and rephasing lobe 406 being used for each shot, in other embodiments the slice-select gradient 404, rephasing lobe 406, or both, can differ between shots.

Following excitation of the nuclear spins in the prescribed imaging slice, data within a given segment are acquired by sampling a series of echo signals in the presence of an alternating readout gradient 408. The alternating readout gradient 408 is preceded by the application of a pre-winding gradient 410 that acts to move the first sampling point along the frequency-encoding, or readout, direction by a prescribed distance in k-space. Spatial encoding of the echo signals along a phase-encoding direction can be performed by a series of phase-encoding gradient blips 412, which are played out between the lobes of the alternating readout gradient 408 such that each echo signal is separately phase-encoded. The phase-encoding gradient blips 412 are preceded by the application of a pre-winding gradient 414 that acts to move the first sampling point along the phase-encoding direction by a prescribed distance in k-space. In some embodiments, the pre-winding gradient 414 will be different between multiple shots because each interleave acquires a different set of k-space lines. Together, the pre-winding gradients 410 and 414 act to begin the sampling of k-space at a prescribed k-space location.

Following the spatial encoding performed by the frequency-encoding and phase-encoding gradients, a spoiling gradient may be applied along any of the three axes (i.e., frequency-encode, phase-encode, and/or slice-select) to dephase the remaining transverse magnetization. This gradient may or may not remain constant across each repetition of the pulse sequence.

This pulse sequence for a given segment is repeated a plurality of times to acquire the full set of k-space data for a given slice. In these repetitions of the pulse sequence, the flip angle of the RF excitation pulse 402 is varied. For instance, the flip angle may be α in one repetition and may be β≠α in a subsequent repetition, as illustrated in FIG. 4. As described above, the RF excitation pulses 402 are specifically designed such that the slice profiles and through-plane phase are matched across k-space interleaves, regardless of the flip angle associated with the RF excitation pulse 402.

The pre-winding gradient 414 prior to the phase-encoding gradient blips 412 may differ between segments to allow the phase-encoding gradient blips 412 to encode a different set of k-space lines in each interleave. In the two-segment example, the first interleave may include the odd-numbered k-space lines and the second interleave may include the even-numbered k-space lines, such that the two interleaves sample the full set of k-space lines for a given image slice.

In another embodiment, each of the two interleaves may include every fourth line of k-space, such that together the two interleaves sample only half of the k-space lines in a given image. In this undersampled case, the missing k-space lines can be estimated with parallel imaging reconstruction techniques, such as GRAPPA.

This pulse sequence for acquiring all segments in a single image slice may be repeated a plurality of times while applying a different slice-selective gradient 404 during each repetition such that a plurality of slice locations are sampled.

In an example study, the methods described in the present disclosure were implemented to design RF pulses for use in imaging studies on two whole-body MRI systems with field strengths of 3 T and 7 T. Functional MRI ("fMRI") was performed at a spatial resolution of 0.6 mm isotropic at 7 T. At both field strengths, the nominal VFA flip angles used were α={45°, 90°} or {35°, 45°, 90°} for two or three shots, respectively, such that equal magnetization was generated for each shot with maximal SNR and without requiring dummy pulses prior to every repetition.

Four subjects were scanned at rest at 3 T with conventional segmented EPI, and VFA-FLEET EPI with sinc (VFA-FLEET-sinc) and SLR (VFA-FLEET-SLR) pulses, using 2 or 3 segments ($N_{seg}$), unaccelerated, 96×96 matrix size, 2.1-mm isotropic resolution, 30/33 slices ($N_{seg}$=2/3), 20% slice gap, echo time (TE)=30 ms, repetition time (TR)=$N_{seg}$×2.4 s, 62 repetitions. The flip angle of VFA-FLEET that determines the image signal level and contrast is the first flip angle, i.e., 45° for the 2-shot sequence and 35° for the 3-shot sequence. A decrease in absolute signal intensity is therefore expected relative to conventional scans with higher flip angles when decreased flip angles are used. Combined segmented-accelerated at 3 T was tested on two subjects using a 128×128 matrix size, 1.5-mm isotropic resolution, 33 or 31 slices ($N_{seg}$=2 or 3), no slice gap, TE=30 ms, TR=$N_{seg}$×2.2 s, and all combinations of $N_{seg}$=2 or 3 and acceleration factor R=3 or 4 resulting in an effective acceleration of $N_{seg}$×R for each segment.

At 7 T, experiments were performed using a multichannel brain receive coil array and a birdcage transmit coil. Temporal signal-to-noise ratio ("tSNR") was measured in two subjects at rest with conventional segmented EPI, VFA-FLEET-sinc, and VFA-FLEET-SLR at 1 mm isotropic resolution, 2 shots, acceleration factor R=4 (i.e., 8-fold undersampling per shot). Two subjects were scanned with VFA-FLEET-SLR while viewing a standard 2 Hz counterphase flickering black-and-white "dartboard" visual stimulus in blocks of 30 s ON/30 s OFF, repeated four times per run. Imaging parameters were 0.6 mm isotropic resolution, in-plane field of view=192×192 mm², 3 shots, R=4, 32 slices, TE=27 ms, volume TR=5.95 s. No partial Fourier was used in any acquisition.

Images were reconstructed offline using navigator-based ghost-correction within each segment, then navigator-based ghost-correction between segments. Additionally, to account for differences in shot-to-shot signal, a normalization factor that minimized the mean-square difference between navigators was applied to the segments. The accelerated images were reconstructed using GRAPPA after combining the segments using the methods described above. All time-series underwent motion correction by co-registering all volumes to their respective middle time points and the series at rest also underwent drift correction with a voxelwise linear regression. The data acquired during the visual stimulation were analyzed using a standard General Linear Model analysis to detect BOLD response to the visual activation using the FSL FEAT software package without explicit spatial smoothing.

The tSNR, which can be estimated as each voxel's temporal average divided by its standard deviation, and skew—the deviation of a voxel's temporal intensity distribution from normality—were used to characterize the temporal stability of the various acquisitions at rest. TSNR was highest for the conventional-segmented acquisitions and lowest for VFA-FLEET-SLR although differences in flip angle and slice profile explain some of these differences. The inter-segment normalization did remove stable ghosts in both VFA-FLEET acquisitions, but at the cost of decreased tSNR, however the stable ghosts before this normalization were lower in the VFA-FLEET-SLR data than in the VFA-FLEET-sinc data, suggesting that normalization may not be necessary for VFA-FLEET-SLR.

Applications of the high-resolution/low-blur, motion-robust, artifact-free segmented EPI sequences that can implement the RF pulse designs described in the present disclosure include all domains that predominantly use EPI, such as functional, diffusion, and perfusion imaging. Diffusion imaging, which typically uses a spin-echo EPI acquisition and therefore is made more complicated by an added refocusing RF pulse, can be achieved using the recursive pulse design and image reconstruction algorithms developed for gradient-echo EPI described above. Perfusion imaging, which typically is performed using arterial spin labeling ("ASL"), also utilizes EPI and requires both adequate resolution and a short echo time, which can also be achieved with segmented EPI enabled by VFA-FLEET. Other applications include perfusion/permeability imaging via dynamic susceptibility contrast ("DSC") techniques, anatomical imaging including (e.g., T1, SWI, and FLAIR), and emerging "all-EPI" fast radiological examinations.

As mentioned previously, SMS imaging is compatible with VFA-FLEET, and has previously been demonstrated for conventional segmented EPI, which has the added benefit of incorporating advantageous Controlled Aliasing or "CAIPI" slice shifting by simply adding phase shifts to the RF pulses. Using RF phase shifts obviates the need for gradient blips to perform CAIPI, which can increase EPI encoding speed. Incorporating SMS can increase the temporal efficiency of VFA-FLEET by offsetting the increased acquisition time introduced by splitting the readout into several segments.

While an SLR pulse design approach is described above, the method of tailoring the slice profiles of the train of RF pulses to match across varying flip angles can be achieved using other design approaches for other pulse families as well. Several new applications are also possible, because in many domains the relatively low spatial resolution of EPI achievable by the available MRI instrumentation is insufficient. With the potential for high-resolution the proposed segmented EPI could be particularly relevant for imaging patient populations prone to motion (such as uncomfortable/uncooperative patients and pediatric patients), where fast imaging with low distortion/blurring and high resolution is required.

VFA-FLEET offers solutions to the encoding limits on single-shot EPI, the intermittent ghosting of conventional-segmented EPI, and the varying slice profile from scaled sinc RF pulses through recursive SLR RF pulse design. As VFA-FLEET does not use outer-volume suppression or innervolume excitation, it has the potential to image the whole brain at sub-millimeter resolution without prolonging the echo time or introducing unwanted spatial blurring.

Figure 5:
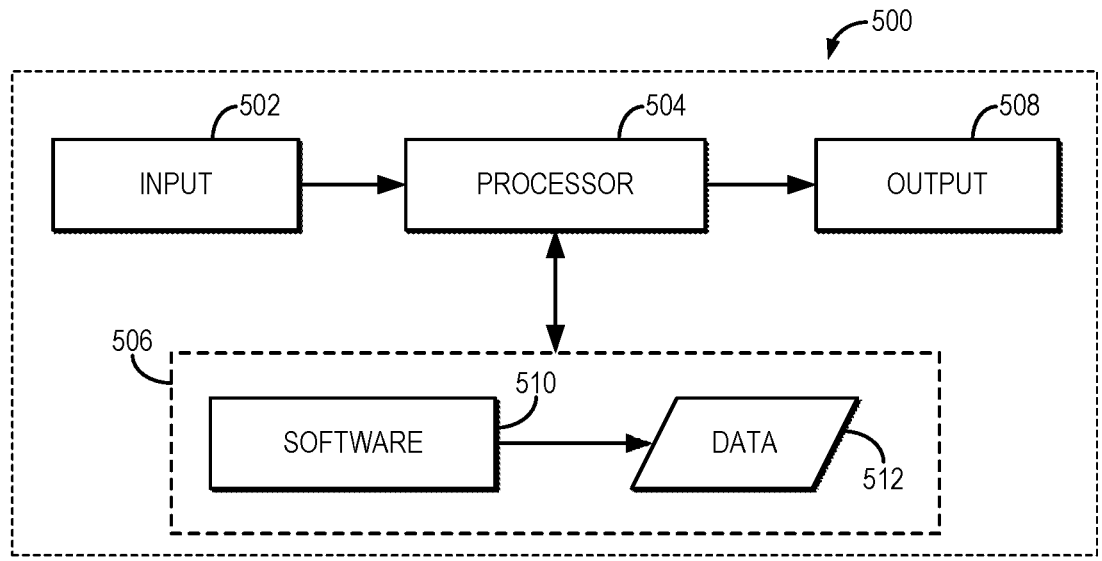
FIG. 5 is an example of a computer system that can be used to design RF pulses according to embodiments described in the present disclosure.

Referring now to FIG. 5, a block diagram of an example of a computer system 500 that can perform the methods described in the present disclosure is shown. The computer system 500 generally includes an input 502, at least one hardware processor 504, a memory 506, and an output 508. Thus, the computer system 500 is generally implemented with a hardware processor 504 and a memory 506.

In some embodiments, the computer system 500 can be a workstation, a notebook computer, a tablet device, a mobile device, a multimedia device, a network server, a mainframe, one or more controllers, one or more microcontrollers, or any other general-purpose or application-specific computing device.

The computer system 500 may operate autonomously or semi-autonomously, or may read executable software instructions from the memory 506 or a computer-readable medium (e.g., a hard drive, a CD-ROM, flash memory), or may receive instructions via the input 502 from a user, or any another source logically connected to a computer or device, such as another networked computer or server. Thus, in some embodiments, the computer system 500 can also include any suitable device for reading computer-readable storage media.

In general, the computer system 500 is programmed or otherwise configured to implement the methods and algorithms described in the present disclosure. For instance, the computer system 500 can be programmed to design RF pulses using the techniques described in the present disclosure.

The input 502 may take any suitable shape or form, as desired, for operation of the computer system 500, including the ability for selecting, entering, or otherwise specifying parameters consistent with performing tasks, processing data, or operating the computer system 500. In some aspects, the input 502 may be configured to receive data, such as desired pulse sequence parameters, desired slice profiles, desired flip angles, and so on. Such data may be processed as described above to design RF pulses. In addition, the input 502 may also be configured to receive any other data or information considered useful for designing RF pulses using the methods described above.

Among the processing tasks for operating the computer system 500, the one or more hardware processors 504 may also be configured to carry out any number of post-processing steps on data received by way of the input 502.

The memory 506 may contain software 510 and data 512, such as desired pulse sequence parameters, desired slice profiles, desired flip angles, and so on, and may be configured for storage and retrieval of processed information, instructions, and data to be processed by the one or more hardware processors 504. In some aspects, the software 510 may contain instructions directed to designing RF pulses as described in the present disclosure.

In addition, the output 508 may take any shape or form, as desired, and may be configured for displaying designed RF pulse waveforms, slice profiles, and other desired information.

Figure 6:
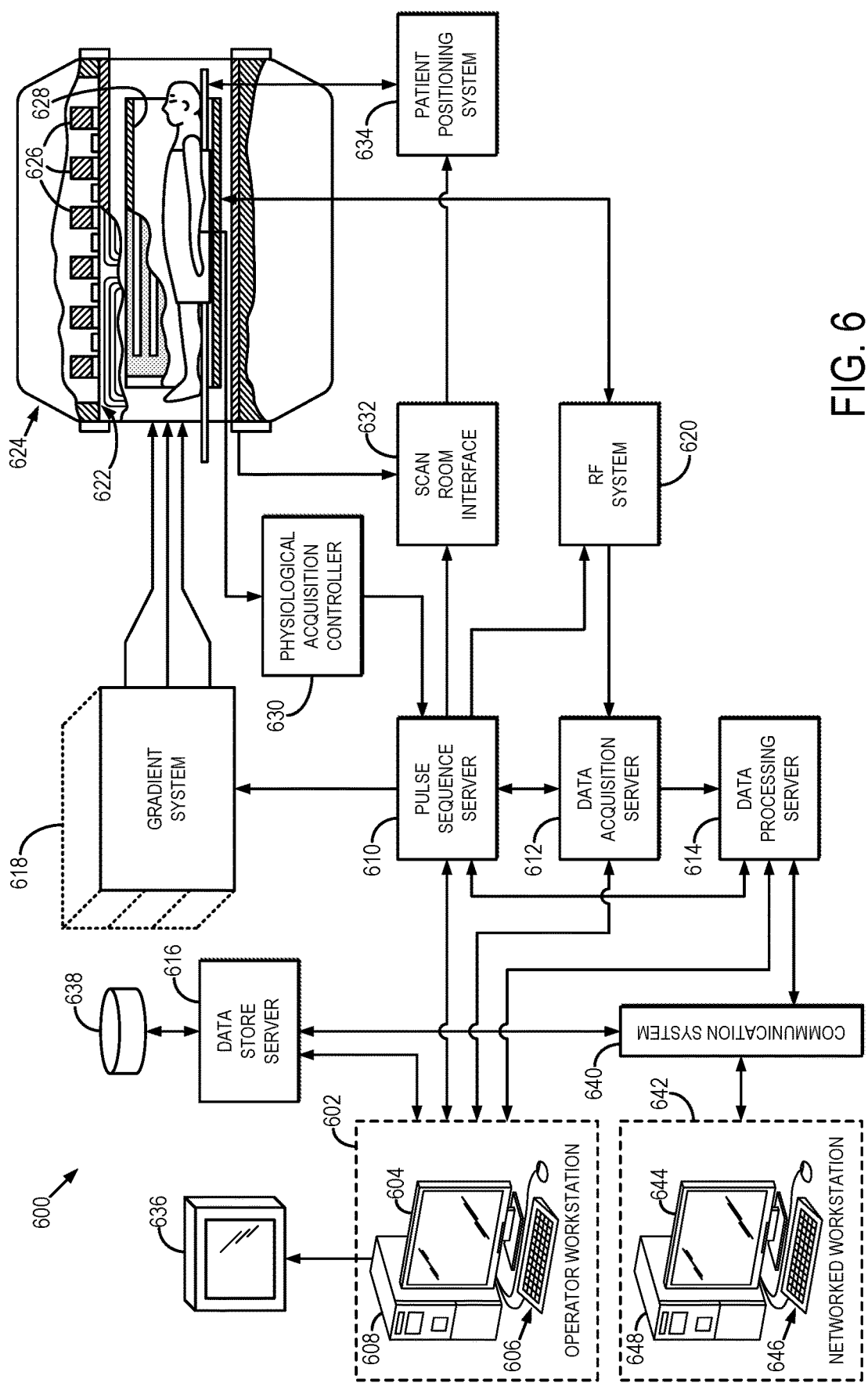
FIG. 6 is a block diagram of an example MRI system that can implement embodiments described in the present disclosure.

Referring particularly now to FIG. 6, an example of an MRI system 600 that can implement the methods described here is illustrated. The MRI system 600 includes an operator workstation 602 that may include a display 604, one or more input devices 606 (e.g., a keyboard, a mouse), and a processor 608. The processor 608 may include a commercially available programmable machine running a commercially available operating system. The operator workstation 602 provides an operator interface that facilitates entering scan parameters into the MRI system 600. The operator workstation 602 may be coupled to different servers, including, for example, a pulse sequence server 610, a data acquisition server 612, a data processing server 614, and a data store server 616. The operator workstation 602 and the servers 610, 612, 614, and 616 may be connected via a communication system 640, which may include wired or wireless network connections.

The pulse sequence server 610 functions in response to instructions provided by the operator workstation 602 to operate a gradient system 618 and a radiofrequency ("RF") system 620. Gradient waveforms for performing a prescribed scan are produced and applied to the gradient system 618, which then excites gradient coils in an assembly 622 to produce the magnetic field gradients $G_x$, $G_y$, and $G_z$ that are used for spatially encoding magnetic resonance signals. The gradient coil assembly 622 forms part of a magnet assembly 624 that includes a polarizing magnet 626 and a whole-body RF coil 628.

RF waveforms are applied by the RF system 620 to the RF coil 628, or a separate local coil to perform the prescribed magnetic resonance pulse sequence. Responsive magnetic resonance signals detected by the RF coil 628, or a separate local coil, are received by the RF system 620. The responsive magnetic resonance signals may be amplified, demodulated, filtered, and digitized under direction of commands produced by the pulse sequence server 610. The RF system 620 includes an RF transmitter for producing a wide variety of RF pulses used in MRI pulse sequences. The RF transmitter is responsive to the prescribed scan and direction from the pulse sequence server 610 to produce RF pulses of the desired frequency, phase, and pulse amplitude waveform. The generated RF pulses may be applied to the whole-body RF coil 628 or to one or more local coils or coil arrays.

The RF system 620 also includes one or more RF receiver channels. An RF receiver channel includes an RF preamplifier that amplifies the magnetic resonance signal received by the coil 628 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \qquad (2);$$

and the phase of the received magnetic resonance signal may also be determined according to the following relationship:

$$\varphi = \tan^{-1}\left(\frac{Q}{I}\right). \quad (3)$$

The pulse sequence server 610 may receive patient data from a physiological acquisition controller 630. By way of example, the physiological acquisition controller 630 may receive signals from a number of different sensors connected to the patient, including electrocardiograph ("ECG") signals from electrodes, or respiratory signals from a respiratory bellows or other respiratory monitoring devices. These signals may be used by the pulse sequence server 610 to synchronize, or "gate," the performance of the scan with the subject's heart beat or respiration.

The pulse sequence server 610 may also connect to a scan room interface circuit 632 that receives signals from various sensors associated with the condition of the patient and the magnet system. Through the scan room interface circuit 632, a patient positioning system 634 can receive commands to move the patient to desired positions during the scan.

The digitized magnetic resonance signal samples produced by the RF system 620 are received by the data acquisition server 612. The data acquisition server 612 operates in response to instructions downloaded from the operator workstation 602 to receive the real-time magnetic resonance data and provide buffer storage, so that data is not lost by data overrun. In some scans, the data acquisition server 612 passes the acquired magnetic resonance data to the data processor server 614. In scans that require information derived from acquired magnetic resonance data to control the further performance of the scan, the data acquisition server 612 may be programmed to produce such information and convey it to the pulse sequence server 610. For example, during pre-scans, magnetic resonance data may be acquired and used to calibrate the pulse sequence performed by the pulse sequence server 610. As another example, navigator signals may be acquired and used to adjust the operating parameters of the RF system 620 or the gradient system 618, or to control the view order in which k-space is sampled. In still another example, the data acquisition server 612 may also process magnetic resonance signals used to detect the arrival of a contrast agent in a magnetic resonance angiography ("MRA") scan. For example, the data acquisition server 612 may acquire magnetic resonance data and processes it in real-time to produce information that is used to control the scan.

The data processing server 614 receives magnetic resonance data from the data acquisition server 612 and processes the magnetic resonance data in accordance with instructions provided by the operator workstation 602. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 614 are conveyed back to the operator workstation 602 for storage. Real-time images may be stored in a data base memory cache, from which they may be output to operator display 602 or a display 636. Batch mode images or selected real time images may be stored in a host database on disc storage 638. When such images have been reconstructed and transferred to storage, the data processing server 614 may notify the data store server 616 on the operator workstation 602. The operator workstation 602 may be used by an operator to archive the images, produce films, or send the images via a network to other facilities.

The MRI system 600 may also include one or more networked workstations 642. For example, a networked workstation 642 may include a display 644, one or more input devices 646 (e.g., a keyboard, a mouse), and a processor 648. The networked workstation 642 may be located within the same facility as the operator workstation 602, or in a different facility, such as a different healthcare institution or clinic.

The networked workstation 642 may gain remote access to the data processing server 614 or data store server 616 via the communication system 640. Accordingly, multiple networked workstations 642 may have access to the data processing server 614 and the data store server 616. In this manner, magnetic resonance data, reconstructed images, or other data may be exchanged between the data processing server 614 or the data store server 616 and the networked workstations 642, such that the data or images may be remotely processed by a networked workstation 642.

The present disclosure has described one or more preferred embodiments, and it should be appreciated that many equivalents, alternatives, variations, and modifications, aside from those expressly stated, are possible and within the scope of the invention.

The invention claimed is:

1. A method for designing radio frequency (RF) pulses for use in a multi-shot pulse sequence implemented with a magnetic resonance imaging (MRI) system, the method comprising:
   recursively designing a plurality of RF pulses with a processor of a computer system by:
   (a) selecting a desired number of RF pulses to design for a series of RF pulses, wherein the series of RF pulses comprises a last RF pulse and one or more preceding RF pulses;
   (b) selecting a flip angle for the last RF pulse using the computer system;
   (c) recursively assigning a flip angle for each of the one or more preceding RF pulses based on the flip angle selected for the last RF pulse, using the computer system;
   (d) computing a target slice profile using the computer system, the target slice profile defining a desired spatial profile of transverse magnetization in an imaging slice;
   (e) computing an RF pulse waveform for each of the plurality of RF pulses to achieve the target slice profile by:
      computing an RF pulse waveform for an initial RF pulse in the plurality of RF pulses based on the target slice profile;
      for each successive RF pulse in the plurality of RF pulses, measuring a residual longitudinal magnetization remaining after each one of the plurality of RF pulses preceding a current RF pulse and incorporating the residual longitudinal magnetization into the RF pulse waveform design for the current RF pulse; and (f) storing in a memory of the computer system as RF pulse parameters:
the flip angle for the last RF pulse;
each flip angle for the one or more preceding RF pulses;
the RF pulse waveform for the initial RF pulse in the plurality of RF pulses; and
each RF pulse waveform for each successive RF pulse in the plurality of RF pulses.

2. A method for producing an image of a subject using a magnetic resonance imaging (MRI) system, the method comprising:
(a) acquiring k-space data from a slice in a subject using a processor of the MRI system to perform a pulse sequence that includes:
a multi-shot variable flip angle (VFA) radio frequency (RF) excitation that excites spins in the slice and comprises a plurality of different RF excitation pulses each having a flip angle that maximizes measured signals and achieves consistent signal across excitations;
a multi-shot echo planar imaging (EPI) data acquisition that acquires k-space data after each RF excitation pulse by sampling magnetic resonance signals generated by the excited spins in a plurality of different segments of k-space;
(b) reconstructing an image of the subject from the acquired k-space data using the processor; and
(c) storing the image in a storage connected to the MRI system; and
wherein each of the plurality of different RF excitation pulses is recursively designed such that slice profiles of the plurality of different RF excitation pulses are matched for each of the different segments of k-space by designing each RF excitation pulse to account for longitudinal magnetization remaining after each preceding RF excitation pulse.

3. The method of claim 1, wherein the one or more preceding RF pulses comprises at least two RF pulses.

4. The method of claim 1, wherein each flip angle for the one or more preceding RF pulses is recursively assigned according to $\alpha_{i-1}=\tan^{-1}(\sin(\alpha_i))$, wherein $\alpha_i$ is the flip angle for an ith RF pulse in the plurality of RF pulses and $\alpha_{i-1}$ is the flip angle for an (i−1)th RF pulse in the plurality of RF pulses.

5. The method of claim 1, wherein the flip angle for the last RF pulse is selected to at least one of:
maximize measured signal;
be 90 degrees; or
be greater than 90 degrees.

6. The method of claim 1, wherein each of the flip angle for the last RF pulse and each flip angle for the one or more preceding RF pulses is different.

7. The method of claim 1, wherein each flip angle for the one or more preceding RF pulses is selected to achieve constant transverse magnetization after each RF pulse in the plurality of RF pulses.

8. The method of claim 1, wherein computing the RF pulse waveform for each successive RF pulse in the plurality of RF pulses also includes incorporating a longitudinal relaxation when measuring the residual longitudinal magnetization remaining after each one of the plurality of RF pulses preceding the current RF pulse.

9. The method of claim 8, wherein each flip angle for the one or more preceding RF pulses is assigned by reducing each flip angle until a desired solution is achieved.

10. The method of claim 1, wherein each RF pulse waveform is computed using a Shinnar-Le Roux (SLR) pulse design algorithm.

11. The method of claim 10, wherein a phase of an alpha polynomial in the SLR pulse design algorithm is incorporated into a beta polynomial in the SLR pulse design algorithm so as to flatten a phase of the target slice profile and achieve a constant isodelay time of the plurality of RF pulses.

12. The method of claim 1, wherein a time-bandwidth product of the initial RF pulse is increased for each subsequent one of the plurality of RF pulses by a constant factor so as to account for increasing spatial frequencies generated in the target slice profile.

13. The method of claim 12, wherein the constant factor also accounts for achieving an equal time-bandwidth for each of the plurality of RF pulses.

14. The method of claim 1, wherein the multi-shot pulse sequence is a variable flip angle (VFA) fast low-angle excitation echo-planar technique (FLEET) pulse sequence.

15. The method of claim 1, further comprising sending the RF pulse parameters to an MRI system and performing a pulse sequence with the MRI system using the RF pulse parameters to generate a plurality of RF excitation pulses in order to generate and acquire magnetic resonance data.

16. The method of claim 2, wherein designing each RF excitation pulse also incorporates longitudinal relaxation between RF pulses when accounting for longitudinal magnetization remaining after each preceding RF excitation pulse.

17. The method of claim 2, wherein the plurality of different segments of k-space comprises a plurality of different interleaved segments of k-space.

18. The method of claim 2, wherein the EPI data acquisition is a fast low-angle excitation echo-planar technique (FLEET) in which the segments of k-space for the slice are acquired consecutively in time.

19. The method of claim 18, wherein when signal intensities across each of the different segments of k-space are not equal, additional corrections are computed and applied to each segment to balance them.

20. The method of claim 19, wherein the additional corrections are computed by acquiring one-dimensional navigator signals before each readout using only frequency-encoding gradients and normalizing remaining magnitude differences across the segments of k-space by a scalar factor.

21. The method of claim 19, wherein the additional corrections are computed by reconstructing an image for each of the plurality of different RF excitation pulse and applying a two-dimensional normalization across segments of k-space based on a ratio of the image of each RF pulse relative to an image from a reference RF pulse.

* * * * *